(12) United States Patent
Hirai

(10) Patent No.: US 8,702,210 B2
(45) Date of Patent: Apr. 22, 2014

(54) PIEZOELECTRIC ELEMENT, LIQUID EJECTING HEAD AND LIQUID EJECTING APPARATUS

(71) Applicant: Seiko Epson Corporation, Tokyo (JP)

(72) Inventor: Eiju Hirai, Okaya (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 13/761,638

(22) Filed: Feb. 7, 2013

(65) Prior Publication Data

US 2013/0201258 A1    Aug. 8, 2013

(30) Foreign Application Priority Data

Feb. 8, 2012  (JP) .................. 2012-024885

(51) Int. Cl.
*B41J 2/045* (2006.01)
*H01L 41/047* (2006.01)

(52) U.S. Cl.
USPC ................. 347/70; 347/69; 310/365

(58) Field of Classification Search
None
See application file for complete search history.

(56) References Cited

U.S. PATENT DOCUMENTS

2009/0219345 A1   9/2009  Yazaki et al.
2009/0244210 A1*  10/2009 Shimada .................. 347/70
2009/0284568 A1   11/2009 Yazaki

FOREIGN PATENT DOCUMENTS

JP   2009-172878   8/2009
JP   2009-196329   9/2009

OTHER PUBLICATIONS

Wikipedia Article: Gold, Introduction section, Aug. 24, 2013.*

* cited by examiner

*Primary Examiner* — Lisa M Solomon
(74) *Attorney, Agent, or Firm* — Harness, Dickey & Pierce, P.L.C.

(57) ABSTRACT

A configuration is provided in which at least one end of a piezoelectric body active portion is defined by an end of a second electrode, a portion of configuring the piezoelectric body active portion of a first electrode is covered with a piezoelectric body layer, the first electrode and the piezoelectric body layer are extended to the outside of the end of the second electrode which defines the end of the piezoelectric body active portion, the first electrode includes an exposure portion which is not covered with the piezoelectric body layer and extends further outside than the end of the second electrode, and on the end of the piezoelectric body layer which forms the exposure portion, an independent electrode which is electrically independent from the second electrode is provided.

8 Claims, 10 Drawing Sheets

PIEZOELECTRIC ELEMENT, LIQUID EJECTING HEAD AND LIQUID EJECTING APPARATUS

BACKGROUND

1. Technical Field

The present invention relates to a piezoelectric element having a first electrode, a piezoelectric body layer and a second electrode, and a liquid ejecting head and a liquid ejecting apparatus which include the piezoelectric element.

2. Related Art

A typical example of a liquid ejecting head mounted on a liquid ejecting apparatus includes an ink jet type recording head which ejects ink droplets from a nozzle. Although configurations of the ink jet type recording head are diversified, for example, there is a configuration in which the ink droplets are ejected by a piezoelectric element being driven. The piezoelectric element is provided on a vibration plate configuring one surface of a pressure generation chamber. The vibration plate is deformed by the driven piezoelectric element. Thereby, the pressure in the pressure generation chamber is increased and thus the ink droplets are ejected from the nozzle communicating with the pressure generation chamber.

Further, the piezoelectric element mounted on the liquid ejecting head or the like includes, for example, a deflecting vibration mode of the piezoelectric element configured such that a piezoelectric body layer formed of a piezoelectric material that exhibits an electrical-mechanical conversion function is interposed between a first electrode and a second electrode.

In the above configuration of the piezoelectric element, for example, due to moisture or the like, a leakage current occurs between the first electrode and the second electrode, and thereby there is a possibility that the piezoelectric body layer may be destroyed. In order to suppress such destruction of the piezoelectric body layer, for example, there is a piezoelectric element which is covered with a protection film. Further, for example, a surface of the piezoelectric body layer is covered with an upper electrode (second electrode), so that the occurrence of the leakage current between a lower electrode (first electrode) and the upper electrode (second electrode) is suppressed (refer to JP-A-2009-172878).

As is in the invention according to JPA-2009-172878, by covering the surface of the piezoelectric body layer with the second electrode, it is possible to suppress the destruction of the piezoelectric body layer. However, as shown in FIG. 4 of JP-A-2009-172878, there may be a case where an exposure portion of the piezoelectric body layer needs to be separately covered with a protection film. That is, there is a possibility that the destruction of the piezoelectric body layer may not be sufficiently suppressed without the protection film.

Such a problem is present not only in the ink jet type recording head, but also in other liquid jet heads ejecting a liquid other than the ink.

SUMMARY

An advantage of some aspects of the invention is that it provides a piezoelectric element, a liquid ejecting head and a liquid ejecting apparatus which are able to sufficiently suppress destruction of a piezoelectric body layer.

According to an aspect of the invention, there is provided a piezoelectric element including: a first electrode provided on a vibration plate; a piezoelectric body layer provided on the first electrode; and a second electrode provided on the piezoelectric body layer, wherein at least one end of the piezoelectric body active portion in which the piezoelectric body layer is interposed between the first electrode and the second electrode, is defined by an end of the second electrode, wherein the first electrode has a portion configuring of the piezoelectric body active portion covered with the piezoelectric body layer, and the first electrode and the piezoelectric body layer are extended to the outside of the end of the second electrode which defines the end of the piezoelectric body active portion, wherein the first electrode includes an exposed portion which is not covered with the piezoelectric body layer and extends further outside than the end of the second electrode, and wherein an independent electrode which is electrically independent from the second electrode is provided on the end of the piezoelectric body layer which forms the exposure portion.

In the aspect of the invention, it is possible to effectively suppress occurrence of a leakage current between the first electrode and the second electrode, and to sufficiently suppress the destruction of the piezoelectric body layer resulting from the leakage current without covering the piezoelectric body layer with the protection film. Further, by providing the independent electrode, the disconnection due to over-etching the first electrode, which occurs when patterning the second electrode, can be suppressed.

Here, for example, in a case where a through hole configuring the exposure portion is formed on the piezoelectric body layer which is present further outside than the end of the second electrode, it is preferable that the independent electrode be continuously provided over the periphery of the through hole. As a result, the leakage current between the first electrode and the second electrode can be more reliably suppressed from occurring.

Further, it is preferable that the independent electrode be formed of the same material as the second electrode. As a result, the independent electrode can be simultaneously formed when forming the second electrode and thus the manufacturing cost can be reduced.

Further, according to another aspect of the invention, there is provided a liquid ejecting head including a plurality of pressure generation chambers communicating with nozzles ejecting a liquid, and the piezoelectric element, as described above, which causes a pressure change in each pressure generation chamber.

In the aspect of the invention, a liquid ejecting head capable of enhancing the durability and reliability of the piezoelectric element can be realized.

Here, it is preferable that the first electrodes configuring the piezoelectric element be formed in a strip shape, and be respectively connected to each other via a connection wire which is connected to the exposure portion so as to configure a common electrode which is common to a plurality of the piezoelectric elements. As a result, since the exposure portion of the first electrode is covered with the connection wire, the destruction of the piezoelectric layer due to the leakage current can be more reliably suppressed from occurring.

Furthermore, according to still another aspect of the invention, there is provided a liquid ejecting apparatus including the liquid ejecting head described above. In the aspect of the invention, a liquid ejecting apparatus having improved durability and reliability of the piezoelectric element can be realized.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, the invention will be described in detail with reference to an exemplary embodiment of the present invention.

Figure 1:
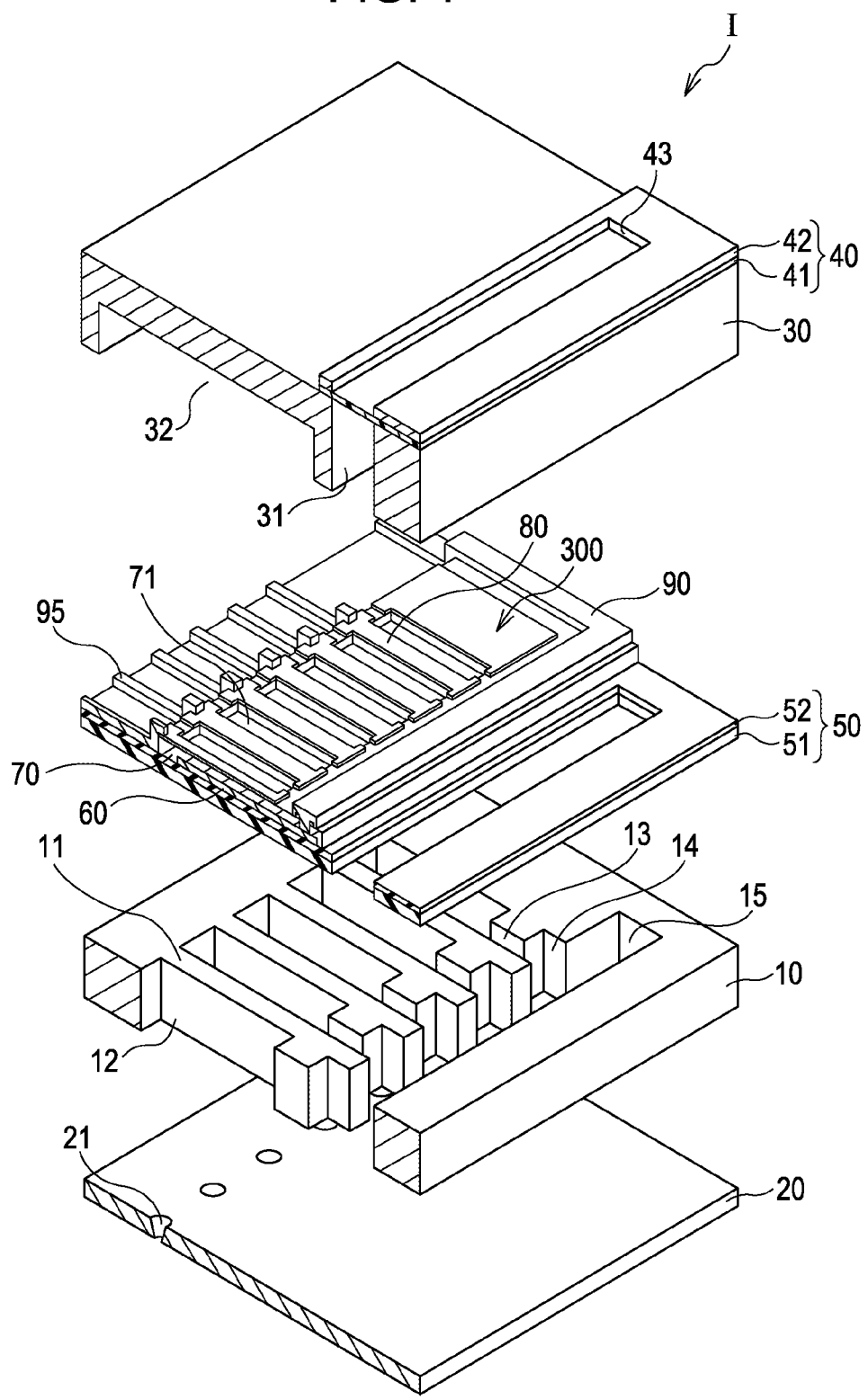
FIG. 1 is an exploded perspective view of a recording head according to an embodiment of the present invention.
Figure 2A:
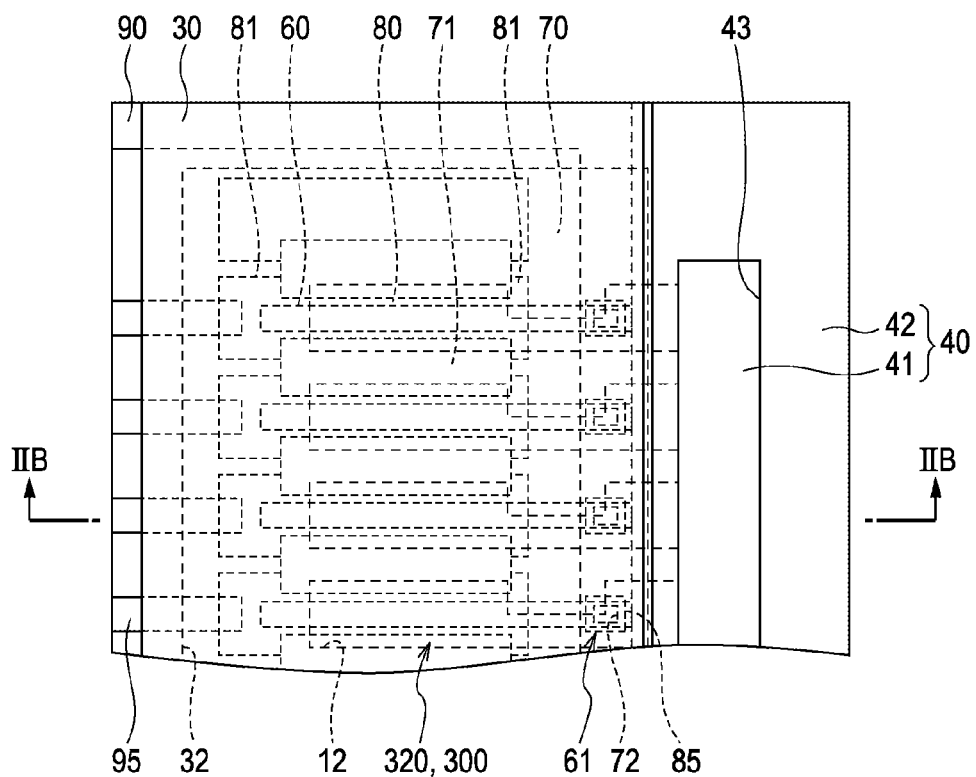
FIG. 2A is a plan view and FIG. 2B is a cross-sectional view of the recording head according to an embodiment of the present invention.
Figure 2B:
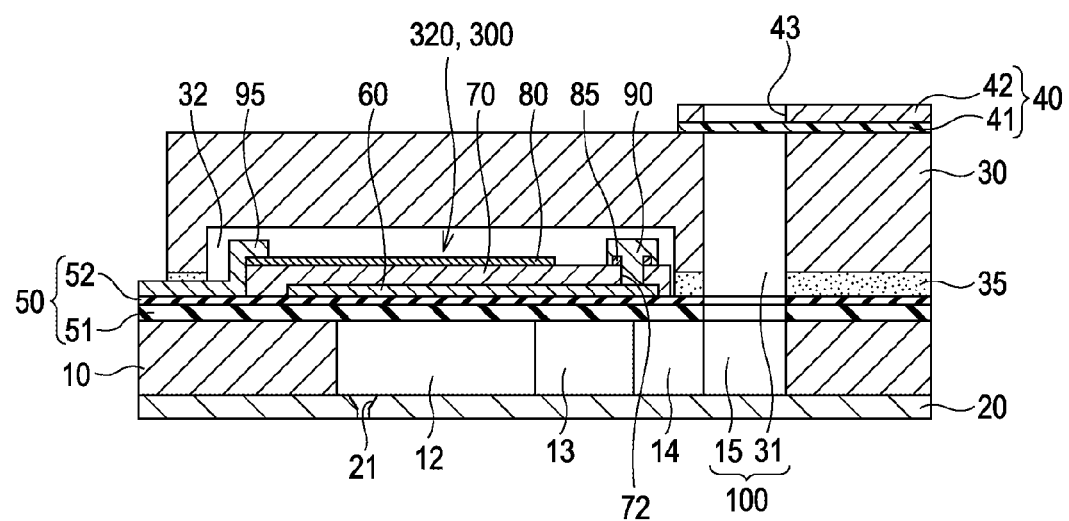

FIG. 1 is an exploded perspective view of an ink jet recording head which is an example of a liquid ejecting head according to an embodiment of the present invention, and FIG. 2A is a plan view of FIG. 1, and FIG. 2B is a cross-sectional view taken along line IIB-IIB in FIG. 2A.

As shown in the drawing, in a flow path forming substrate 10, pressure generation chambers 12 are provided side by side, which are partitioned by a plurality of partition walls 11 in the width direction (the lateral direction). Further, in one end side in the longitudinal direction of the pressure generation chamber 12 of the flow path forming substrate 10, an ink supply path 13 and a communication path 14 are partitioned by the partition wall 11. In addition, in one end of the communication path 14, a communication section 15 configuring a portion of a manifold 100 which is a common ink chamber (liquid chamber) of each pressure generation chamber 12 is formed. That is, in the flow path forming substrate 10, a liquid flow path formed of the pressure generation chamber 12, the ink supply path 13, the communication path 14 and the communication section 15 are provided.

On one side surface of the flow path forming substrate 10, a vibration plate 50 is formed. The vibration plate 50 according to the present embodiment is configured by an elastic film 51 formed on the flow path forming substrate 10 and an insulator film 52 formed on the elastic film 51. In addition, on the other side surface of the flow path forming substrate 10, a nozzle plate 20 where a nozzle 21 communicating with each pressure generation chamber 12 is protruded is bonded. Further, a liquid flow path of the pressure generation chamber 12 is formed by anisotropically etching the flow path forming substrate 10 from the other side surface and the one side surface of the liquid flow path of the pressure generation chamber 12 is configured of the vibration plate 50 (elastic film 51).

On the insulator film 52 configuring the vibration plate 50, a piezoelectric element 300 configured by a first electrode 60, a piezoelectric body layer 70 and a second electrode 80 is formed. In the piezoelectric body layer configuring the piezoelectric element 300, a voltage distortion occurs by applying a voltage to both electrodes at a portion interposed between the first electrode 60 and the second electrode 80. A substantial drive portion where the voltage distortion of the piezoelectric element 300 occurs is referred to as a piezoelectric body active portion 320.

In addition, with the first electrode 60 and the second electrode 80 configuring the piezoelectric element 300, any one electrode configures a common electrode that is common to a plurality of the piezoelectric elements 300 and the other electrode is patterned for each pressure generation chamber 12 and then configures an individual electrode which is independent for each piezoelectric element 300. In the present embodiment, it is assumed that the first electrode 60 is the common electrode which is common to the plurality of piezoelectric elements 300, and the second electrode 80 is the individual electrode which is independent for each piezoelectric element 300.

Further, the configuration of the piezoelectric element 300 of the present embodiment will be described in detail with reference to FIGS. 3, 4A and 4B. In addition, FIG. 3 is a plan view illustrating a configuration of the piezoelectric element and FIG. 4A is a sectional view taken along line IVA-IVA and FIG. 4B is a sectional view taken along line IVB-IVB of FIG. 3.

Figure 3:
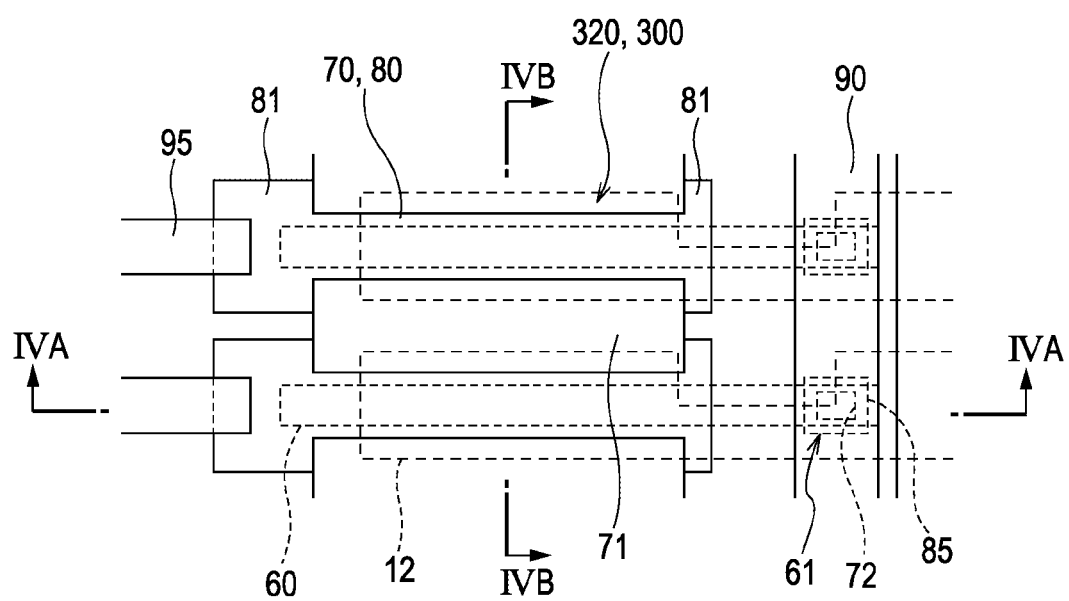
FIG. 3 is a plan view illustrating a structure of a piezoelectric element according to an embodiment of the present invention.
Figure 4A:
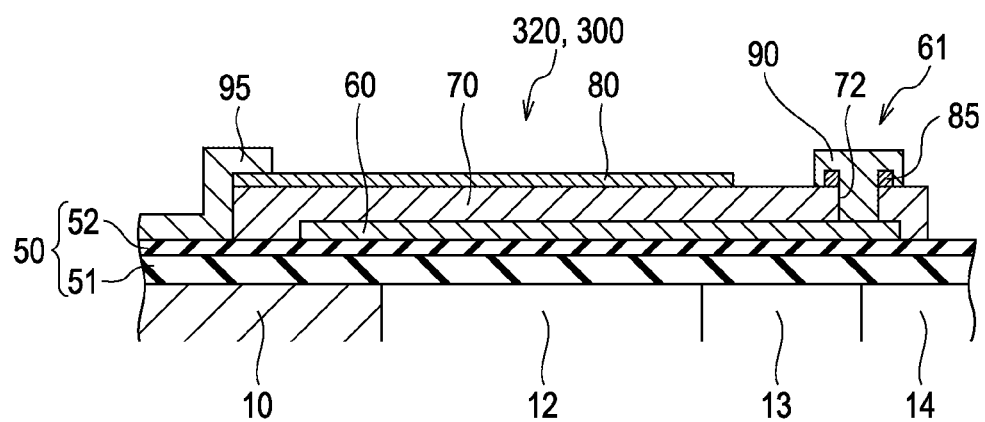
FIGS. 4A and 4B are cross-sectional views illustrating a structure of a piezoelectric element according to an embodiment of the present invention.
Figure 4B:
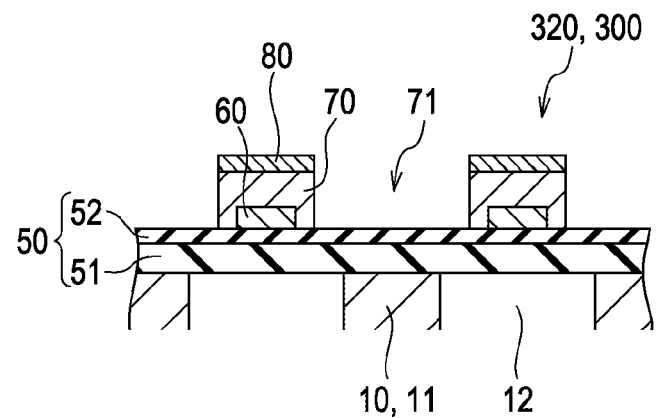

As illustrated in FIGS. 3, 4A and 4B, the first electrode 60 is independently provided for each piezoelectric element 300, opposing each pressure generation chamber 12. The first electrode 60, for example, is formed in a strip shape on the insulator film 52 configuring the vibration plate 50, opposing to each pressure generation chamber 12. In addition, the first electrode 60 is formed with a narrower width than the width of the pressure generation chamber 12, and in the longitudinal direction (the longitudinal direction of the pressure generation chamber 12) of the piezoelectric element 300, both ends are provided so as to be located outside of the pressure generation chamber 12, respectively. Although details thereof will be described later, the respective first electrodes 60 which are provided in the strip shape are connected to each other by a connection wire outside of the pressure generation chamber 12 and configure a common electrode that is common to the plurality of piezoelectric elements 300.

The piezoelectric body layer 70, being independent in a portion opposing each pressure generation chamber 12, is provided continuously along the parallel arrangement direction of the pressure generation chamber 12 in the area outside the pressure generation chamber 12 in the longitudinal direction. That is, the piezoelectric body layer 70 is provided continuously in the portion corresponding to the plurality of pressure generation chambers 12 which are arranged in parallel, with the exception of a through groove 71 formed in the portion opposing the partition wall 11 which partitions each pressure generation chamber 12.

The portion opposing the pressure generation chamber 12 of the piezoelectric body layers 70 is formed with a wider width than the width of the first electrode 60 and with a narrower width than the width of the pressure generation chamber 12. In the longitudinal direction (the longitudinal direction of the pressure generation chamber 12) of the piezoelectric element 300, the piezoelectric body layer 70 is formed continuously to the outside of the pressure generation chamber 12. More specifically, both ends of the piezoelectric body layer 70 are located further outside than the end of the first electrode 60. The first electrode 60 is covered with the piezoelectric layer 70.

As the material of the piezoelectric body layer 70, for example, a ferroelectric piezoelectric material such as zirconate titanate lead (PZT), a relax ferroelectric body in which metal such as niobium, nickel, magnesium, bismuth or yttrium is added thereto, a lead-free piezoelectric material that does not contain lead such as bismuth titanate are used.

The second electrode 80 is isolated for each pressure generation chamber 12 and configures the individual electrode of each piezoelectric element 300. A portion opposing each pressure generation chambers 12 of the second electrode 80 is formed with substantially the same width as that of the piezoelectric layer 70. In addition, in the longitudinal direction of the piezoelectric element 300, the second electrode 80 is also extended to the outside of the pressure generation chamber 12.

In other words, the piezoelectric body active portion 320 which is a substantial drive portion of the piezoelectric element 300 is provided so as to oppose each pressure generation chamber 12, and both ends of the piezoelectric body active portion 320 in the longitudinal direction of the piezoelectric element 300 are located outside the pressure generation chamber 12.

Here, at least one end of the piezoelectric body active portion 320 in the longitudinal direction of the piezoelectric element 300 is defined by an end of the second electrode 80. For example, in the present embodiment, in the ink supply path 13 side of the pressure generation chambers 12, an end of the piezoelectric body active portion 320 is defined by an end of the second electrode 80.

That is, in the ink supply path 13 side of the pressure generation chamber 12, the end of the second electrode 80 is located further inside (the pressure generation chamber 12 side) than the end of the first electrode 60. In other words, in the ink supply path 13 side of the pressure generation chamber 12, the first electrode 60 and the piezoelectric body layer 70 are extended to the outside of the end of the second electrode 80.

On the piezoelectric layer 70 that is extended to the outside of the end of the second electrode 80, for example, a connection wire 90 made of gold (Au) or the like is provided. The connection wire 90 is connected to the first electrode 60 which is provided corresponding to each pressure generation chamber 12 in a strip shape and configures a portion of the common electrode of the piezoelectric element 300. In addition, a portion of the common electrode is configured by the connection wire 90 and thereby it is possible to decrease resistance of the common electrode.

The first electrode 60 as described above is basically covered with the piezoelectric body layer 70. However, an exposure portion 61 which exposes a surface which is not covered with the piezoelectric body layer 70 is provided on the outside further than the end of the second electrode 80. In the present embodiment, a through hole 72 configuring the exposure portion 61 on the piezoelectric body layer 70 that is extended to the outside of the second electrode 80 is formed. Then, the connection wire 90 is connected to each first electrode 60 through the through hole 72.

Here, at a peripheral portion of the through hole 72 of the piezoelectric body layer 70, which configures the exposure portion 61, that is, at the end of the piezoelectric layer 70 forming the exposure portion 61, an independent electrode 85 which is independent from the second electrode 80 is formed.

The independent electrode 85 is continuously formed over the periphery of the through hole 72.

By such an independent electrode 85 being provided, it is possible to suppress the occurrence of the leakage current between the first electrode 60 and the second electrode 80, and accordingly it is possible to effectively suppress the destruction of the piezoelectric body layer 70 resulting from the leakage current. For example, even if the piezoelectric layer 70 is not covered with the protection film or the like, it is possible to suppress the destruction of the piezoelectric body layer 70. In addition, the independent electrode 85 is provided in a form of a separate island which is independent from the first electrode 60 and the second electrode 80. Therefore, the leakage does not occur between the independent electrode 85 and the first electrode 60 or between the independent electrode 85 and the second electrode 80.

Materials of the independent electrode 85 are not particularly limited. However, it is preferable to be formed with the same material as that of the second electrode 80. Since the independent electrode 85 can be formed simultaneously with the second electrode 80, the manufacturing cost can be suppressed from increasing.

Incidentally, the second electrode 80 is extended to the end of the piezoelectric body layer 70 at the opposite side to the ink supply path 13 of the pressure generation chamber 12. That is, the end of the second electrode 80 is located further outside than the end of the first electrode 60, and the end of the piezoelectric body active portion 320 is defined by the end of the first electrode 60. Then the second electrode 80 has a wide portion 81 which is wider than the width of the pressure generation chamber 12 at both sides of the pressure generation chamber 12 (refer to FIG. 2A). Accordingly, the vibration plate 50 opposing the pressure generation chamber 12 is formed with a substantially uniform thickness and thus there is no partially thinned portion. Therefore, it is possible to suppress the occurrence of cracks or the like on the vibration plate 50 when driving the piezoelectric element 300.

On the flow path forming substrate 10 where such a piezoelectric element 300 is formed, the protection substrate 30 is adhered by an adhesive 35. On the protection substrate 30, a manifold section 31 which configures at least a portion of a manifold 100 is provided. The manifold section 31 passes through the protection substrate 30 in the thickness direction, and is formed over the width direction of the pressure generation chamber 12, and thus communicates with the communication section 15 of the flow path forming substrate 10, as described above, so as to configure the manifold 100.

Further, in a region opposing the piezoelectric element 300 of the protection substrate 30, a piezoelectric element holding section 32 is provided. The piezoelectric element holding section 32 may have a space of such an extent that does not disturb the movement of the piezoelectric element 300 and the space may be sealed or may not be sealed.

As such a protection plate 30, it is preferable to use the material having substantially the same thermal expansion coefficient as the flow path forming substrate 10, for example, glass, ceramic material or the like. In the present embodiment, as the material of the protection substrate 30, the silicon single crystal substrate of the same material as the flow path forming substrate 10 is used.

On the protection substrate 30, a compliance substrate 40 formed of a sealing film 41 and a fixing plate 42 is bonded. The sealing film 41 is made of a material having flexibility and a low rigidity. One surface of the manifold section 31 is sealed by a sealing film 41. The fixed plate 42 is formed of a rigid material such as metal. A region opposing the manifold 100 of the fixing plate 42 becomes an opening section 43 which is completely removed in the thickness direction. Therefore, one surface of the manifold 100 is sealed with only the sealing film 41 having the flexibility.

In addition, although not shown in the drawings, a drive circuit for driving a plurality of the piezoelectric elements 300 is fixed onto the protection substrate 30, and the drive circuit and a lead electrode 95 are electrically connected to each other via the connection wire made of a conductive wire such as a bonding wire.

In the ink jet type recording head I of the present embodiment like that, an ink is taken in from an ink inlet connected to an external ink supply unit (not shown), and after the inside from the manifold 100 to the nozzle 21 is filled with the ink, in accordance with a recording signal from the drive circuit 120, a voltage is applied to between the first electrode 60 and the second electrode 80, each of which corresponds to the pressure generation chamber 12. Thereby the vibration plate 50 together with the piezoelectric element 300 flexibly deforms to increase the pressure in the pressure generation chamber 12 and thus, ink droplets are ejected from the nozzle 21.

Here, a method of manufacturing the piezoelectric element of the ink jet type recording head I of the present embodiment will be described with reference to FIGS. 5A to 7B.

Figure 5A:
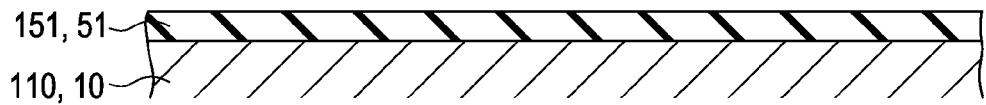
FIGS. 5A to 5D are cross-sectional views illustrating a method of manufacturing a recording head according to an embodiment of the present invention.

First, as shown in FIG. 5A, a silicon dioxide film 151 made of silicon dioxide (SiO$_2$), which configures the elastic film 51 on the surface of a wafer 110 for the flow path forming substrate which is a silicon wafer in which a plurality of the flow path forming substrates 10 are integrally formed is formed.

Figure 5B:
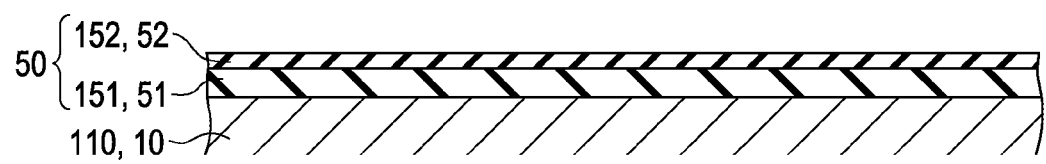

Then, as shown in FIG. 5B, on the elastic film 51 (silicon dioxide film 151), a zirconium oxide film 152 configuring the insulator film 52 is formed. Thereby the vibration plate 50 which is configured of the elastic film 51 and the insulator film 52 is formed.

Figure 5C:
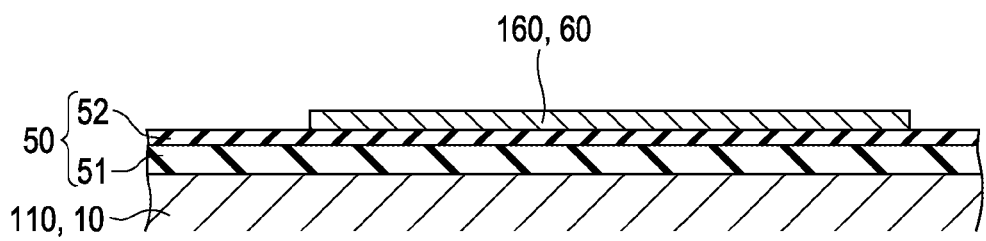

Then, as shown in FIG. 5C, after forming a first electrode forming layer 160 made of platinum and iridium on the insulator film 52, the first electrode forming layer 160 is patterned into a predetermined shape to form the first electrode 60. That is, the first electrode 60 is formed by being patterned in a strip shape, such that the first electrode layer 160 corresponds to each pressure generation chamber 12. The method of forming the first electrode forming layer 160 is not particularly limited, but includes, for example, a sputtering method, a chemical vapor deposition method (CVD method), and the like. In the present embodiment, although platinum and iridium are used as the material of the first electrode 60, the material of the first electrode 60 is not limited thereto and may be only the platinum or iridium, or may be oxide electrode materials such as oxides of other metal materials, lanthanum, nickel, and the like.

Figure 5D:
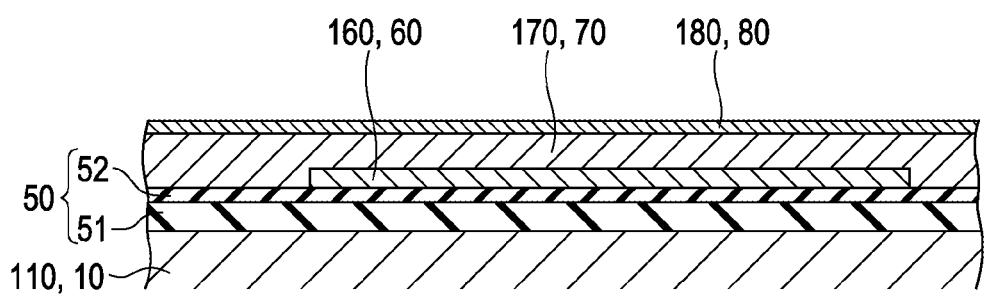

Next, as shown in FIG. 5D, for example, a piezoelectric body layer 170 made of zirconate titanate lead (PZT) or the like, and for example, a second electrode forming layer 180 made of iridium, platinum or the like are formed on the entire surface of the wafer 110 for the flow path forming substrate.

Further, in the method of forming the piezoelectric body layer 170, in this embodiment, a gel is formed by applying and drying a so-called sol where a metal organic substance is dissolved and dispersed in a solvent and further, the gel is baked at a high temperature, so as to obtain the piezoelectric body layer 170 made of a metal oxide. In this manner, the piezoelectric body layer 70 is formed using a so-called sol-gel method. Accordingly, the method of forming the piezoelectric body layer 170 is not particularly limited, for example, a MOD (Metal-Organic Decomposition) method, a sputtering method, a PVD (Physical Vapor Deposition) method such as a laser ablation method, or the like may be used. Further, materials of the second electrode forming layer 180 and a method of forming the same are alike when forming the first electrode forming layer 160.

Figure 6A:
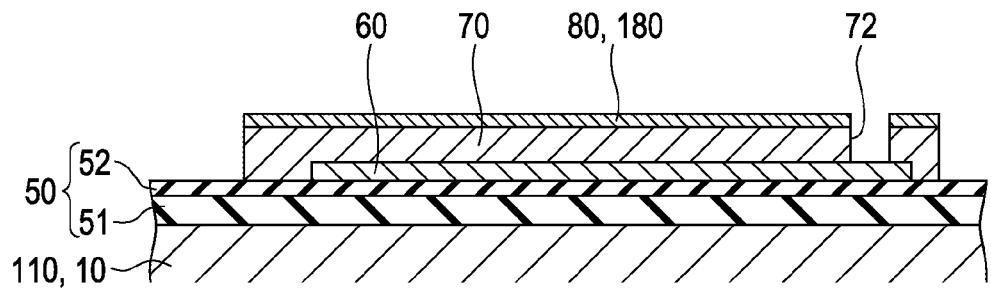
FIGS. 6A to 6C are cross-sectional views illustrating a method of manufacturing a recording head according to an embodiment of the present invention.
Figure 7A:
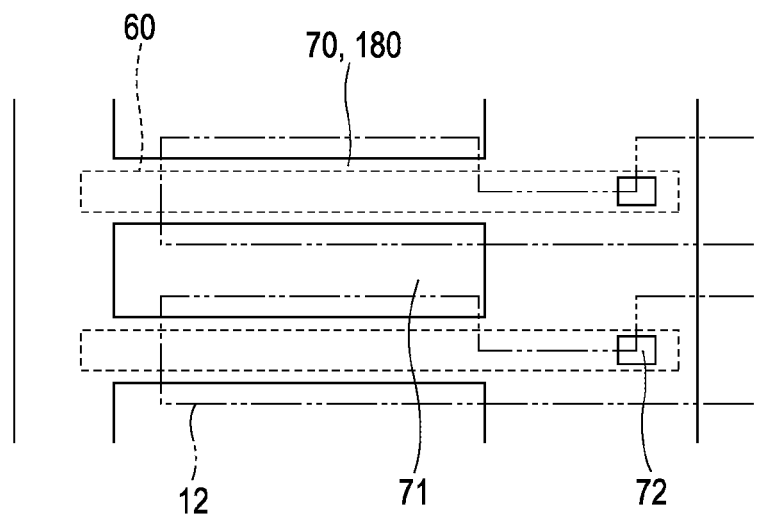
FIGS. 7A and 7B are plan views illustrating a method of manufacturing a recording head according to an embodiment of the present invention.

Next, as shown in FIGS. 6A and 7A, the second electrode forming layer 180 and the piezoelectric body layer 170 are patterned to form a through groove 71 and a through hole 72. In this manner, the second electrode forming layer 180 and the piezoelectric body layer 170 are patterned in a lump sum and thereby the upper surface of the piezoelectric body layer 170 (a region which particularly becomes an active portion) can be protected by the second electrode forming layer 180. That is, the upper surface of the piezoelectric body layer 170 can be protected from process damage in the patterning process. Further, it is possible to secure alignment accuracy between the piezoelectric body layer 70 and the second electrode 80. In addition, a method of etching the second electrode forming layer 180 and the piezoelectric body layer 170 includes for example, a dry etching such as reactive ion etching and ion milling.

Figure 6B:
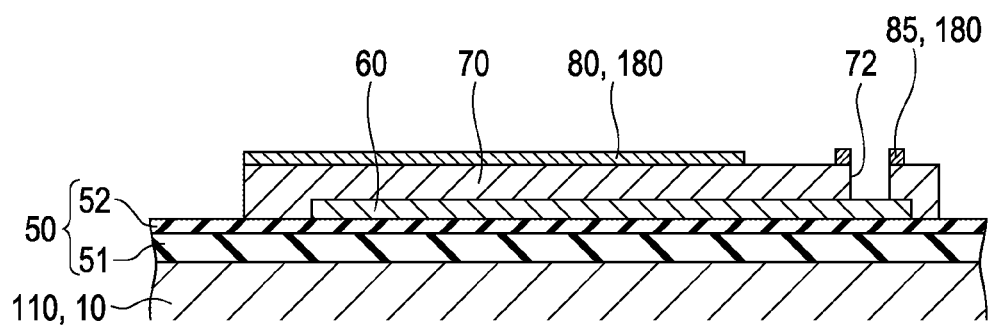
Figure 7B:
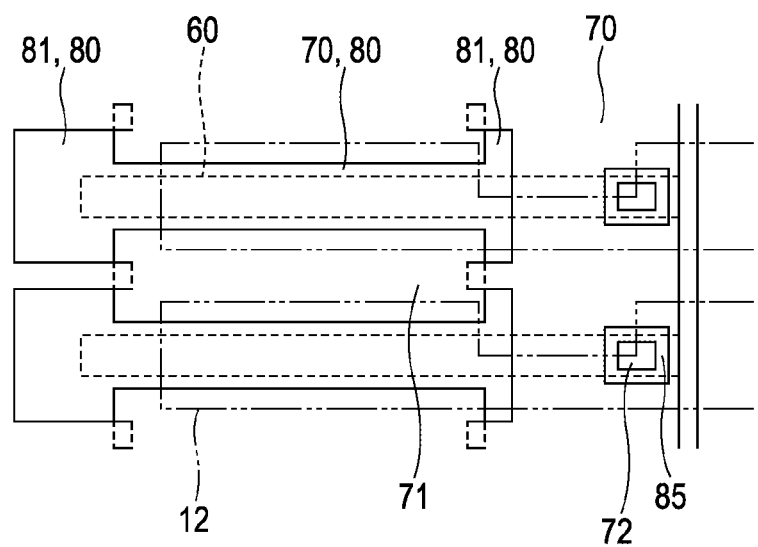

Next, as shown in FIGS. 6B and 7B, the second electrode forming layer 180 is patterned to be separated between the piezoelectric elements 300 and the second electrode 80 which is an individual electrode in which each piezoelectric element 300 is formed. In this case, in this embodiment, an independent electrode 85 is formed at the periphery of the through hole 72. In the independent electrode 85, the inside and the vicinity of the through hole 72 are covered with a resist (not shown) during the patterning of the second electrode 80. That is, the independent electrode 85 is formed by being excluded from the patterning target.

Thus, when patterning the second electrode 80, the first electrode 60 exposed in the through hole 72 is not etched. For this reason, it is possible to avoid a disconnection of the first electrode 60 due to over-etching. Further, it is possible to further effectively suppress the occurrence of a leakage current between the first electrode 60 and the second electrode 80. If the first electrode 60 is over-etched, there is a possibility that the material of the etched first electrode 60 may adhere (redeposition) to the surface of the piezoelectric body layer 70 and the like. Like this, if the material of the first electrode 60 adheres thereto, the leak current easily occurs between the first electrode 60 and the second electrode 80.

Further, in order to prevent the over-etching of the first electrode 60, a region that needs to be protected using the resist is a region of the through hole 72. However, in consideration of the alignment accuracy when processing, in practice, a vicinity region that includes the through hole 72 needs to be protected using the resist. As the result, after patterning the second electrode forming layer 180, the material configuring the second electrode 80 remains in the vicinity of the through hole 72 and thus the independent electrodes 85 surrounding the through hole 72 are formed.

Further, in the present embodiment, the second electrode 80 has a wide width portion 81 outside the pressure generation chamber 12. When patterning the second electrode forming layer 180 to form the second electrode 80, in order to reliably separate the second electrode forming layer 180 at a desired position, in consideration of positional accuracy of the resist, a region opposing the second electrode forming layer 180 and its outside region, for example, a region opposing the through groove 71 (the dashed line region in FIG. 7B) need to be etched at the same time. If only the second electrode 80 is etched, there is a possibility that the material of the second electrode 80 may remain in the vicinity of the longitudinal end of the through groove 71 and thus a short circuit may occur between the adjacent piezoelectric elements 300.

Further, when etching the predetermined region, the insulator film 52 exposed in the through groove 71 is also etched therewith. At this time, if the insulator film 52 opposing the pressure generation chamber 12 is etched, the vibration plate becomes thinner. Accordingly, there is a possibility that a deformation stress may be concentrated and thus cracks may occur when driving the piezoelectric elements 300. For this reason, it is preferable that the predetermined region be not overlapped with the pressure generation chamber 12. In addition, considering the resist alignment accuracy (accurate alignment of the through groove 71 in the width direction) with respect to the through groove 71, it is preferable that the predetermined region have a narrower width than that of the through groove 71. Similarly, if the width of the predetermined region is caused to be narrower than the width of the through groove 71, the wide width portion 81 is formed on the second electrode 80.

Figure 6C:
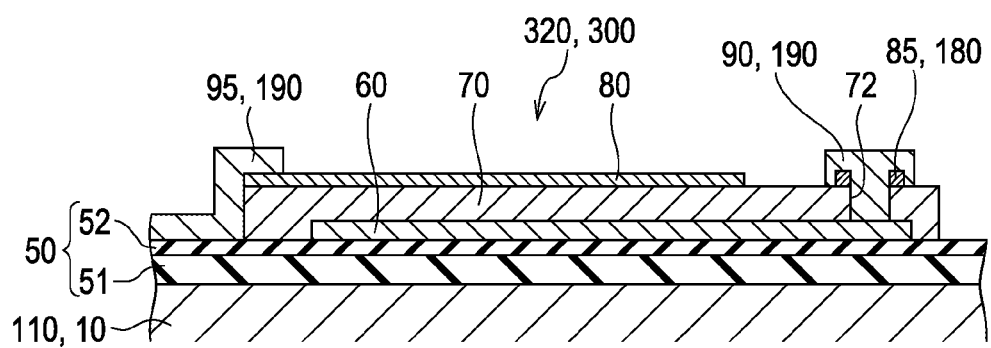

Thereafter that, as shown in FIG. 6C, after forming a wire metal layer 190 made of gold (Au) over the entire surface of the wafer 110 for the flow path forming substrate, a connection wire 90 and each lead electrode 95 is formed by patterning the wire metal layer 190 into a predetermined shape.

As described above, in the invention, the independent electrode 85 independent from the second electrode 80 which is provided on the piezoelectric body layer 70. For example, in the present embodiment, the independent electrode 85 is provided at the periphery of the through hole 72 configuring the exposure portion 61 to which the surface of the first electrode 60 is exposed. As a result, it is possible to suppress the occurrence of the leakage current between the first electrode 60 and the second electrode 80 which drive the piezoelectric element 300. Therefore, the destruction of the piezoelectric body layer 70 resulting from the leakage current can be effectively suppressed. In addition, the disconnection due to over-etching of the first electrode 60, which occurs during the patterning of the second electrode 80, can be effectively suppressed.

As described above, an embodiment of the invention has been described, but the invention is not limited to the above described embodiment of the invention.

Figure 8A:
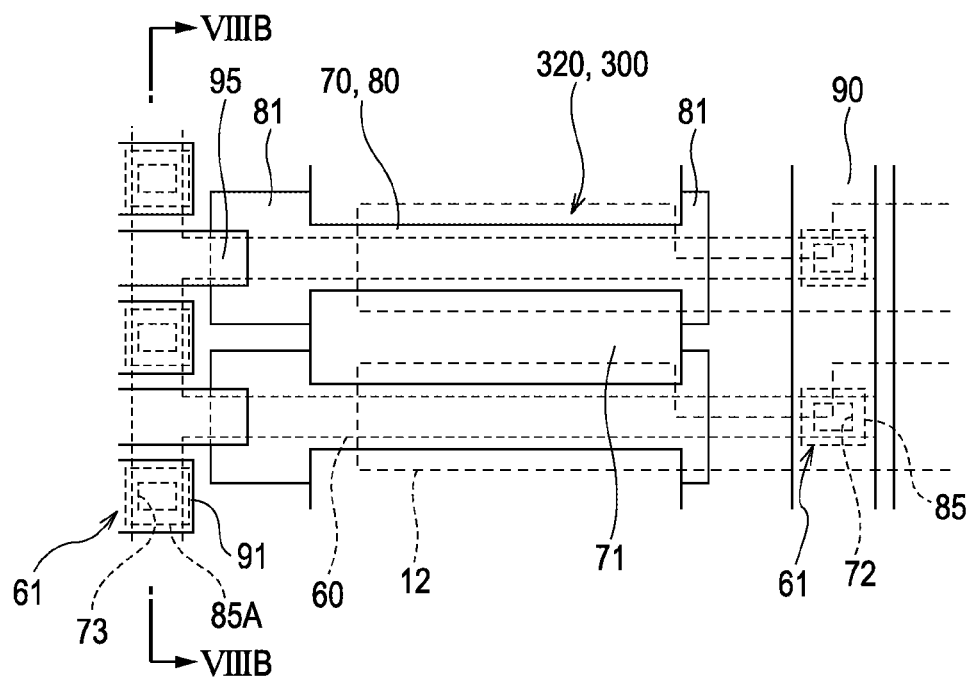
FIG. 8A is a plan view and FIG. 8B is a cross-sectional view illustrating a modification example of a recording head according to an embodiment of the present invention.
Figure 8B:
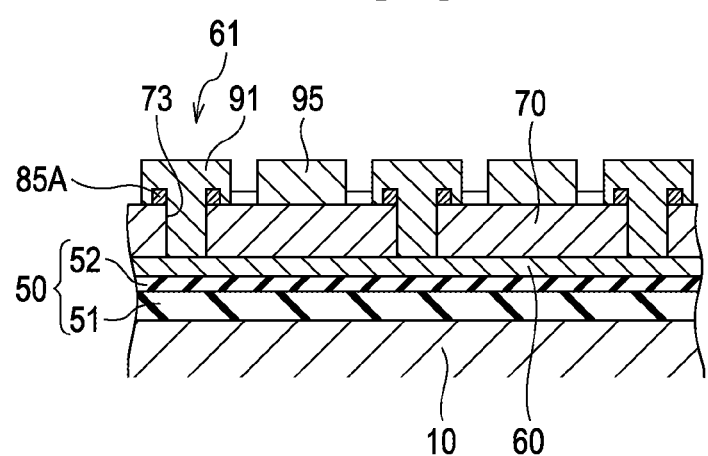

For example, as shown in FIGS. 8A and 8B, the first electrode 60 may be formed in a comb-teeth shape so as to be continuous outside the pressure generation chamber 12 and a second connection wire 91 may be further provided on the piezoelectric body layer 70 between each of the lead electrodes 95 so that the second connection wire 91 is connected to the first electrode 60 via a second through hole 73 formed on the piezoelectric body layer 70. Thereby it is possible to further decrease a resistance value of the common electrode of the piezoelectric elements 300. Then, in a case of such a configuration, an independent electrode 85A which is independent from the second electrode 80 is also provided at the periphery of the second through hole 73, and thereby the leakage current occurring between the first electrode 60 and the second electrode 80 can be effectively suppressed.

Figure 9A:
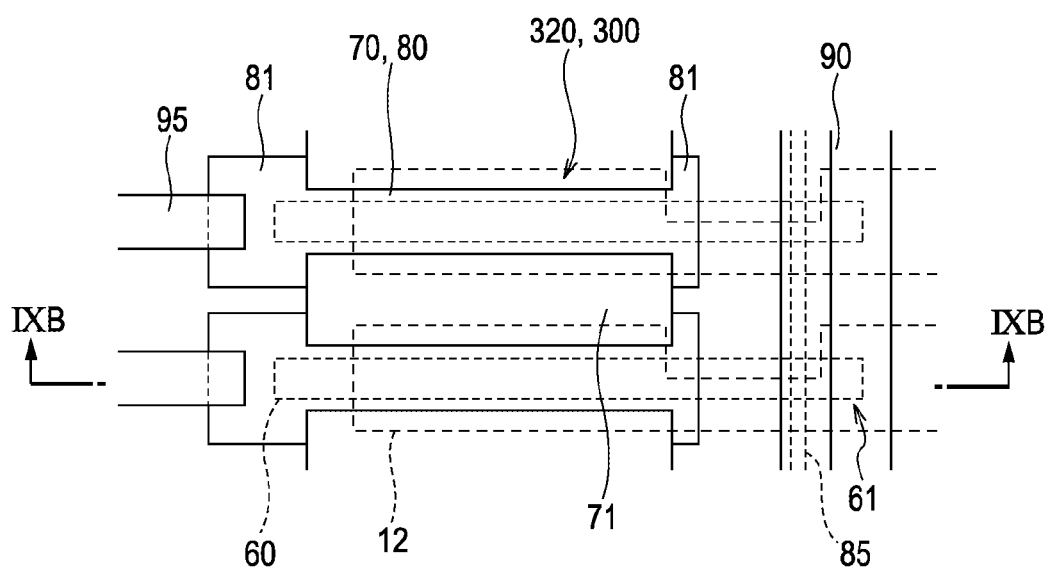
FIG. 9A is a plan view and FIG. 9B is a cross-sectional view illustrating a modification example of a recording head according to an embodiment of the present invention.
Figure 9B:
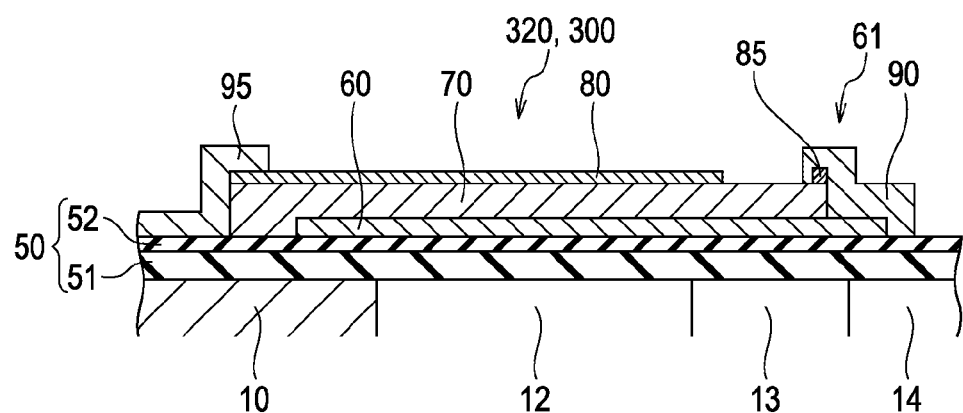

Further, in the embodiment described above, an example of the configuration where a connection wire 90 is connected to the first electrode 60 through the through hole 72 provided in the piezoelectric body layer 70 has been illustrated, but the connection structure between the first electrode 60 and the connection wire 90 is not limited thereto. For example, as shown in FIGS. 9A and 9B, the end of the first electrode 60 may be further extended to the outside than the end of the piezoelectric body layer 70 so as to form the exposure portion 61 and thus using the exposure portion 61, the first electrode 60 may be connected to the connection wire 90. Even in this case, since the independent electrode 85A is provided on the end of the piezoelectric body layer 70 which forms the exposure portion 61, the destruction of the piezoelectric body layer 70 resulting from the leakage current can be suppressed similarly to the embodiment described above.

Figure 10:
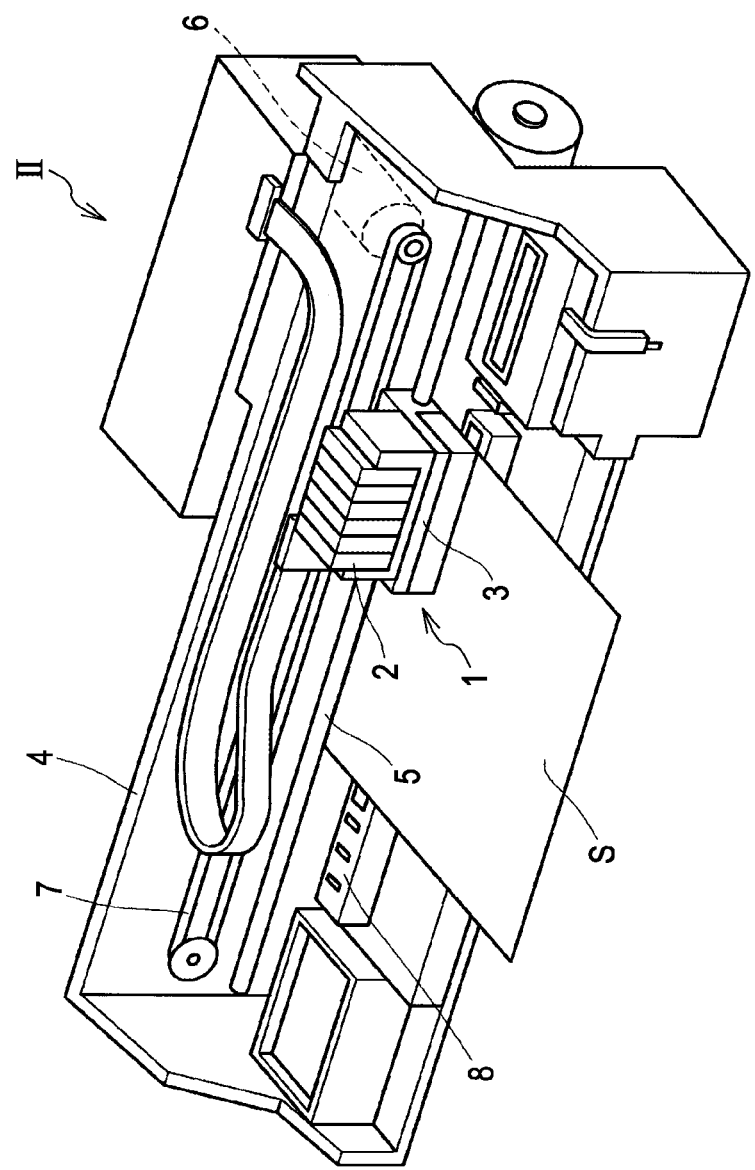
FIG. 10 is a schematic diagram of a recording apparatus according to an embodiment of the present invention.

Further, for example, as shown in FIG. 10, the ink jet type recording head I having such a configuration is mounted on the ink jet type recording apparatus II. A recording head unit 1 having the ink jet type recording head I is provided to have a detachable cartridge 2 configuring an ink supply unit, and a carriage 3 on which the recording head unit 1 is mounted is provided so as to be movable in the axial direction toward a carriage shaft 5 attached to an apparatus main body 4. The recording head unit 1 ejects a black ink composition and a color ink composition, for example.

Then, a drive force of a drive motor 6 is transmitted through a plurality of gears (not shown in drawing) and a timing belt 7 to the carriage 3, and thereby the carriage 3 on which the recording head unit 1 is mounted is moved along the carriage shaft 5. On the other hand, a platen 8 is provided at the apparatus main body 4 along the carriage shaft 5 so that a recording sheet S which is a recording medium such as paper that is fed by a paper feed roller (not shown in drawing) is transported by being wounded around the platen 8.

Then, in the invention, as described above, since the destruction of the piezoelectric element 300 configuring the ink jet type recording head I can be suppressed, it is possible to realize an ink jet type recording apparatus II with an improved durability and reliability.

In addition, in the ink jet type recording apparatus II described above, an example of the ink jet type recording head I (recording head units 1A and 1B) is mounted on the carriage 3 to move in the main scanning direction have been illustrated, but it is not particularly limited thereto. For example, while the ink jet type recording head I is being fixed, printing may be performed by merely moving the recording sheet S such as paper in the sub-scanning direction. Therefore, it is possible to apply the invention even to a so-called line type recording apparatus.

In addition, in the above embodiment, the ink jet type recording head has been described as an example of a liquid ejecting head, but the invention is widely intended for the entire liquid ejecting heads and liquid ejecting apparatuses having the same head and thus it is of course possible to apply even to a liquid ejecting head that ejects a liquid other than the ink. The examples of the other liquid ejecting head include various recording heads used in an image recording apparatus such as a printer, a color material ejecting head used in manufacturing a color filter such as a liquid crystal display, an electrode material ejecting head used in forming electrodes such as an organic EL display, and a FED (field emission display), and a bio-organic substance ejecting head used in manufacturing a bio-chip, and the like.

In addition, the invention is not limited to the piezoelectric element used in the liquid ejecting head, but may also be used for other devices. As the other devices, for example, an ultrasonic device of an ultrasonic transmitter, an ultrasonic motor, and a piezoelectric transformer and the like may be included. In addition, the invention may be applied to the piezoelectric element used as a sensor. As a sensor where the piezoelectric element is used, for example, an infrared sensor, an ultrasonic sensor, a thermal sensor, a pressure sensor, a pyroelectric sensor and the like may be included.

The entire disclosure of Japanese Patent Application No. 2012-024885, filed Feb. 8, 2012 is incorporated by reference herein.

What is claimed is:

1. A piezoelectric element comprising:
   a first electrode provided on a vibration plate;
   a piezoelectric body layer provided on the first electrode; and
   a second electrode provided on the piezoelectric body layer,
   wherein at least one end of a piezoelectric body active portion in which the piezoelectric body layer is interposed between the first electrode and the second electrode is defined by an end of the second electrode,
   wherein the first electrode has a portion configuring the piezoelectric body active portion covered with the piezoelectric body layer, and the first electrode and the piezoelectric body layer are extended to the outside of the end of the second electrode which defines the end of the piezoelectric body active portion,
   wherein the first electrode includes an exposure portion which is not covered with the piezoelectric body layer and extends to further outside than the end of the second electrode,
   wherein on the end of the piezoelectric body layer which forms the exposure portion, an independent electrode which is electrically independent from the second electrode is provided,
   wherein a through hole configuring the exposure portion is formed on the piezoelectric body layer which is present further outside than the end of the second electrode, and
   wherein the independent electrode is continuously provided over the periphery of the through hole.

2. The piezoelectric element according to claim 1,
   wherein the independent electrode is formed of the same material as that of the second electrode.

3. A liquid ejecting head comprising:
   a plurality of pressure generation chambers communicating with nozzles ejecting a liquid; and
   the piezoelectric element according to claim 1, which causes a pressure change in each pressure generation chamber.

4. A liquid ejecting head comprising:
   a plurality of pressure generation chambers communicating with nozzles for ejecting liquid; and
   the piezoelectric element according to claim 2, which causes a pressure change in each pressure generation chamber.

5. The liquid ejecting head according to claim 3,
   wherein the first electrodes configuring each piezoelectric element are formed in a strip shape, and are respectively connected to each other via a connection wire which is connected to the exposure portion so as to configure a common electrode which is common to a plurality of the piezoelectric elements.

6. A liquid ejecting apparatus comprising:
   the liquid ejecting head according to claim 3.

7. A liquid ejecting apparatus comprising:
   the liquid ejecting head according to claim 4.

8. A liquid ejecting apparatus comprising:
   the liquid ejecting head according to claim 5.

* * * * *